(12) United States Patent
Horio

(10) Patent No.: US 8,124,969 B2
(45) Date of Patent: Feb. 28, 2012

(54) SEMICONDUCTOR LIGHT EMITTING ELEMENT AND METHOD FOR MANUFACTURING THE SAME

(75) Inventor: Naochika Horio, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 161 days.

(21) Appl. No.: 12/428,768

(22) Filed: Apr. 23, 2009

(65) Prior Publication Data

US 2009/0267065 A1    Oct. 29, 2009

(30) Foreign Application Priority Data

Apr. 24, 2008   (JP) ................................ 2008-114399

(51) Int. Cl.
*H01L 33/00* (2010.01)
(52) U.S. Cl. ..... 257/43; 257/94; 257/102; 257/E33.019; 257/E33.003
(58) Field of Classification Search .............. 257/43, 257/94, 102, E33.019, E33.003
See application file for complete search history.

(56) References Cited

U.S. PATENT DOCUMENTS

2004/0099876 A1*  5/2004  Niki et al. .......... 257/102
2005/0003632 A1   1/2005  Onishi et al.

FOREIGN PATENT DOCUMENTS

JP   2003-86541 A   3/2003
JP   2007234908    * 9/2007

* cited by examiner

*Primary Examiner* — Cuong Q Nguyen
*Assistant Examiner* — Tran Tran
(74) *Attorney, Agent, or Firm* — Holtz, Holtz, Goodman & Chick, PC

(57) ABSTRACT

A ZnO-based semiconductor light emitting element includes a ZnO-based semiconductor layer formed on a rectangular sapphire A-plane substrate having a principal surface lying in the A-plane {11-20}. The substrate has a thickness of 50 to 200 μm and is surrounded by two parallel first side edges forming an angle in a range of 52.7° to 54.7° with respect to the m-axis orthogonal to the c-axis and two parallel second side edges orthogonal to the first side edges. The light emitting element is obtained by: forming, on a surface of the sapphire A-plane substrate opposite to the surface on which the ZnO-based semiconductor layer is formed, first scribed grooves forming an angle in a range of 52.7° to 54.7° with respect to the m-axis and second scribed grooves orthogonal to the first scribed grooves; and breaking the substrate along the first scribed grooves and then along the second scribed grooves.

7 Claims, 5 Drawing Sheets

US 8,124,969 B2

SEMICONDUCTOR LIGHT EMITTING ELEMENT AND METHOD FOR MANUFACTURING THE SAME

This application claims the priority benefit under 35 U.S.C. §119 of Japanese Patent Application No. 2008-114399 filed on Apr. 24, 2008, which is hereby incorporated in its entirety by reference.

BACKGROUND OF THE INVENTION

1. Field of the Invention

The present invention relates to a ZnO-based semiconductor light emitting element and to a method for manufacturing the same.

2. Description of the Related Art

ZnO-based semiconductor light emitting elements have advantages over other semiconductor light emitting elements, such as having a larger exciton binding energy, using lower-cost raw materials, and being less harmful to people and the environment. Therefore, such ZnO-based semiconductor light emitting elements are expected to provide high-efficiency and low-power consumption devices.

Examples of the substrates used in ZnO-based semiconductor light emitting elements include zinc oxide (ZnO) substrates, sapphire ($\alpha$-$Al_2O_3$) substrates, and silicon carbide (SiC) substrates. Of these, sapphire substrates are preferred because they cost less than zinc oxide and silicon carbide substrates.

In one known method for manufacturing a ZnO-based semiconductor light emitting element using a sapphire substrate, a single crystal of $\alpha$-sapphire is used. A single crystal of $\alpha$-sapphire has a hexagonal crystal structure. Three representative types of substrates cut from such a single crystal are a sapphire C-plane substrate having a principal surface lying in the C-plane ({0001} plane), a sapphire A-plane substrate having a principal surface lying in the A-plane ({11-20} plane), and a sapphire R-plane substrate having a principal surface lying in the R-plane ({10-12} plane).

The ZnO-based semiconductor light emitting element includes a ZnO-based semiconductor layer formed on the substrate. The ZnO-based semiconductor layer is formed by epitaxial growth of ZnO crystals on the substrate and serves as an operating layer composed of, for example, an n-type ZnO layer, a light emitting layer, and a p-type ZnO layer.

When the ZnO-based semiconductor layer is formed on a sapphire substrate, the properties of the grown ZnO crystal vary depending on the principal surface of the sapphire substrate where the layer is formed. When a sapphire C-plane substrate is used, the grown ZnO crystal contains 30° rotated domains, and therefore the crystallinity is poor. When a sapphire R-plane substrate is used, the grown ZnO crystal has streak-like projections on its surface and is not suitable for device formation. When a sapphire A-plane substrate is used, the grown ZnO crystal does not contain 30° rotated domains, and a flat surface can be obtained. Therefore, a sapphire A-plane substrate is most suitably used to produce ZnO-based semiconductor light emitting elements.

Generally, the case, frame, stem, and other components used to mount a semiconductor light emitting element are designed based on the premise that the semiconductor light emitting element has a rectangular shape. Therefore, a rectangular shape is most suitable for semiconductor light emitting elements manufactured by dividing a substrate having a semiconductor layer formed thereon.

The following method is known as a method for dividing a sapphire A-plane substrate having a GaN-based semiconductor layer formed thereon into rectangular pieces. That is, in Japanese Patent Application Laid-Open No. 2003-086541 (corresponding to US 2005/0003632A1), a sapphire A-plane substrate is prepared which has, for example, a diameter of 50.8 mm (2 inches) and a thickness of 300 to 500 μm. The sapphire A-plane substrate includes a GaN-based semiconductor layer formed on a first side. Then, first scribed grooves $L_1$ and second scribed grooves $L_2$ orthogonal to the first scribed grooves $L_1$ are formed on a second side or c-m plane of the sapphire A-plane substrate that is opposite to the first side and is formed by the c-axis and the m-axis orthogonal to the c-axis. In this instance, the first scribed grooves $L_1$ form an angle γ of 47.7 to 51.7° with respect to the c-axis. The second scribed grooves $L_2$ are formed to be orthogonal to the first scribed grooves $L_1$. Next, the sapphire A-plane substrate is broken along the first scribed grooves $L_1$ and then along the second scribed grooves $L_2$ to divide the sapphire A-plane substrate into separate sapphire A-plane substrates. The conventional method disclosed in this publication can form separate rectangular sapphire A-plane substrates so that GaN-based semiconductor light emitting elements can be manufactured with a yield of 96 to 98%.

The present inventors have attempted to apply the method disclosed in Japanese Patent Application Laid-Open No. 2003-086541 to a sapphire A-plane substrate having a ZnO-based semiconductor layer formed thereon. However, the inventors have found that cleavage planes $R_1$ and $R_2$ (thick lines in the figure) deviate substantially from the scribed grooves $L_1$ and $L_2$, as shown in FIG. 1. Therefore when the method disclosed in this patent publication is applied to a sapphire A-plane substrate having a ZnO-based semiconductor layer formed thereon, ZnO-based semiconductor light emitting elements including rectangularly divided sapphire A-plane substrates cannot be manufactured.

Generally, when semiconductor light emitting elements are manufactured, a substrate having a thickness of 300 to 500 μm is ground and polished to a thickness of approximately 200 μm or less and is then cleaved, as described above. If the substrate itself is used for a crystal growth test or an element formation test, the substrate having the original thickness (300 to 500 μm) is often used. In such a test case, the relative depth of the scribed grooves with respect to the thickness of the substrate is smaller than that when the semiconductor light emitting elements are manufactured, and therefore the substrate is more difficult to cleave. The depth of the scribed grooves is generally about 2 to about 6 μm, depending on the hardness of the substrate. The ease of cleavage is not determined only by the depth of the scribed grooves. However, the larger the relative thickness of the substrate with respect to the depth of the scribed grooves, i.e., the smaller the relative depth of the scribed grooves, the more difficult to cleave the substrate. For example, if the depth of scribed grooves is 3 μm, the relative depth of the scribed grooves with respect to a 50 μm thick substrate is 6%, and the relative depth of the scribed grooves with respect to a 100 μm thick substrate is 3%. The relative depth of the scribed grooves with respect to a 200 μm thick substrate is 1.5%, and the relative depth of the scribed grooves with respect to a 430 μm thick substrate is 0.7%.

Therefore, it is desirable to form rectangularly divided sapphire A-plane substrates using not only a sapphire A-plane substrate having a thickness of approximately 200 μm or less but also a sapphire A-plane substrate having a thickness of 300 to 500 μm.

In a semiconductor light emitting element, the light emitted from the light emitting layer is emitted to the outside or attenuated inside the semiconductor light emitting element through one of the following three processes.

1) The light passes through the inside of the semiconductor light emitting element and is emitted to the outside.

2) The light is reflected and scattered inside the semiconductor light emitting element and then emitted to the outside. In this case, part of the light is absorbed by an electrode and the crystal that forms the semiconductor light emitting element.

3) The light is absorbed and attenuated inside the semiconductor light emitting element.

Therefore, to increase the light emitting power of the semiconductor light emitting element, it is necessary to increase the ratio of light emitted to the outside in process 1), to reduce the frequency of reflection and scattering in process 2) to increase the ratio of light emitted to the outside, and to reduce the ratio of light absorbed and attenuated inside the semiconductor light emitting element in process 3).

In one light-extraction technique used to increase the light emitting power of a semiconductor light emitting element, the aspect ratio of the semiconductor light emitting element (the ratio of the side length of the semiconductor light emitting element to the height thereof) can be reduced, i.e., the height of the semiconductor light emitting element can be increased. By increasing the height of the semiconductor light emitting element, the area of the side surfaces thereof is increased, and therefore the amount of light emitted from the side surfaces is increased, so that the light emitting power can be increased.

SUMMARY OF INVENTION

It is an object of the invention to provide a ZnO-based semiconductor light emitting element including a rectangular sapphire A-plane substrate and a ZnO-based semiconductor layer formed on the substrate and to provide a method for manufacturing the same.

To achieve this object, according to one aspect of the present invention a ZnO-based semiconductor light emitting element includes: a sapphire A-plane substrate made of an α-sapphire single crystal and having a principal surface lying in an A-plane {11-20} of the α-sapphire single crystal; and a ZnO-based semiconductor layer formed on the sapphire A-plane substrate. In this element, the sapphire A-plane substrate has a thickness of 50 to 200 µm and is surrounded by two parallel first side edges and two parallel second side edges orthogonal to the two parallel first side edges, the two parallel first side edges forming an angle in a range of 52.7° to 54.7° or in a range of 35.3° to 37.3° with respect to an m-axis of the α-sapphire single crystal that is orthogonal to a c-axis of the α-sapphire single crystal.

With this structure, the ZnO crystal grown on the sapphire A-plane substrate does not contain 30° rotated domains, and therefore a flat surface having no streak-like projections can be obtained. Accordingly, a good ZnO-based semiconductor layer can be formed.

The sapphire A-plane substrate having the ZnO-based semiconductor layer formed thereon is surrounded, on the c-m plane formed by the c- and m-axes, by the two parallel first side edges forming an angle in a range of 52.7° to 54.7° or in a range of 35.3° to 37.3° with respect to the m-axis and the two parallel second side edges orthogonal to the first side edges.

Since the parallel first side edges are orthogonal to the parallel second side edges, the area surrounded by the first and second side edges has a rectangular shape. Therefore, a ZnO-based semiconductor light emitting element is obtained which includes a ZnO-based semiconductor layer formed on a rectangular sapphire A-plane substrate having a thickness of 50 to 200 µm.

When the thickness of the sapphire A-plane substrate is less than 50 µm, the strength of the sapphire A-plane substrate is insufficient. When the thickness is greater than 200 µm, the ZnO-based semiconductor light emitting element is difficult to manufacture.

Preferably, an aspect ratio of the side length of the ZnO-based semiconductor light emitting element to the height of the ZnO-based semiconductor light emitting element is in the range of 2 to 4. When the aspect ratio of the ZnO-based semiconductor light emitting element is in the range of 2 to 4, and more preferably 2 to 3, the light emission area of the side surfaces of the ZnO-based semiconductor light emitting element is large, so that the light emitting power of the ZnO-based semiconductor light emitting element can be increased. When the aspect ratio is less than 2, the light emitting element may be difficult to manufacture. When the aspect ratio is greater than 4, the light emitting power may be insufficient.

According to another aspect of the present invention, a method is provided which includes: forming a member including a ZnO-based semiconductor layer formed on a first surface of a sapphire A-plane substrate, wherein the sapphire A-plane substrate is made of an α-sapphire single crystal, has a principal surface lying in an A-plane {11-20} of the α-sapphire single crystal, and has a thickness of 50 to 200 µm; forming first scribed grooves in a second surface of the sapphire A-plane substrate, the second surface being opposite to the first surface, and each of the first scribed groove forming an angle in a range of 52.7° to 54.7° or in a range of 35.3° to 37.3° with respect to the m-axis of the α-sapphire single crystal that is orthogonal to the c-axis of the α-sapphire single crystal; forming second scribed grooves, which are orthogonal to the first scribed grooves, in the second surface of the sapphire A-plane substrate; and breaking the sapphire A-plane substrate along the first scribed grooves and then along the second scribed grooves to obtain the ZnO based semiconductor light emitting element.

In this manufacturing method, first the ZnO-based semiconductor layer is formed on the first surface of the sapphire A-plane substrate. Subsequently, the second surface of the sapphire A-plane substrate is, for example, ground and polished to reduce the thickness of the sapphire A-plane substrate to 50 to 200 µm. Next, the sapphire A-plane substrate having the ZnO-based semiconductor layer formed thereon is provided with the first scribed grooves and then with the second scribed groove orthogonal to the first scribed groove. Then, the sapphire A-plane substrate is broken along the first scribed grooves and then the second scribed grooves. During the breaking process, cracks propagate from the scribed grooves toward the first surface having the ZnO-based semiconductor layer formed thereon, and the sapphire A-plane substrate is cleaved along the first and second scribed grooves to be divided into rectangular shapes without fail.

Accordingly, with this method of the present invention, a ZnO-based semiconductor light emitting element including a ZnO-based semiconductor layer formed on a sapphire A-plane substrate made of an α-sapphire single crystal and having a principal plane lying in the A plane {11-20} can be manufactured with a high yield.

When the thickness of the sapphire A-plane substrate is less than 50 µm, the strength of the sapphire A-plane substrate is insufficient. When the thickness is greater than 200 µm, the ZnO-based semiconductor light emitting element is not suitable for practical use because the cracks formed in the breaking process may deviate from the scribed grooves, thereby increasing the probability of damaging the element.

Generally, in the process of breaking and dividing a sapphire A-plane substrate having a ZnO-based semiconductor layer formed thereon into separate rectangular ZnO-based semiconductor light emitting elements, when the aspect ratio of each separate light emitting element (the ratio of the side length to the height) is about 4, the sapphire A-plane substrate is difficult to divide. When the aspect ratio is about 3, the yield of the dividing process is low. When the aspect ratio is less than about 3, the yield of the dividing process is extremely low.

In the manufacturing method of the present invention, the sapphire A-plane substrate having the ZnO-based semiconductor layer formed thereon has a thickness of 50 to 200 μm. Therefore, ZnO-based semiconductor light emitting elements rectangularly divided with high precision can be manufactured by breaking the sapphire A-plane substrate along the first and second scribed grooves, even when the aspect ratio of the ZnO-based semiconductor light emitting elements is in the range of 2 to 4.

According to a further aspect of the present invention a method includes: forming a first scribed groove in a surface of a sapphire A-plane substrate which is made of an α-sapphire single crystal, has a principal surface lying in an A plane {11-20} of the α-sapphire single crystal, and has a thickness of 50 to 500 μm, the first scribed groove forming an angle in a range of 52.7° to 54.7° or in a range of 35.3° to 37.3° with respect to an m-axis of the α-sapphire single crystal that is orthogonal to a c-axis of the α-sapphire single crystal; forming a second scribed groove in the surface of the sapphire A-plane substrate, the second scribed groove being orthogonal to the first scribed groove; and breaking the sapphire A-plane substrate along the first scribed groove and then along the second scribed groove.

According to this manufacturing method, a rectangular sapphire A-plane substrate having a thickness of 50 to 500 μm can be easily and reliably manufactured.

BRIEF DESCRIPTION OF DRAWINGS

These and other characteristics, features, and advantages of the present invention will become clear from the following description with reference to the accompanying drawings, wherein.

DETAILED DESCRIPTION

Figure 1:
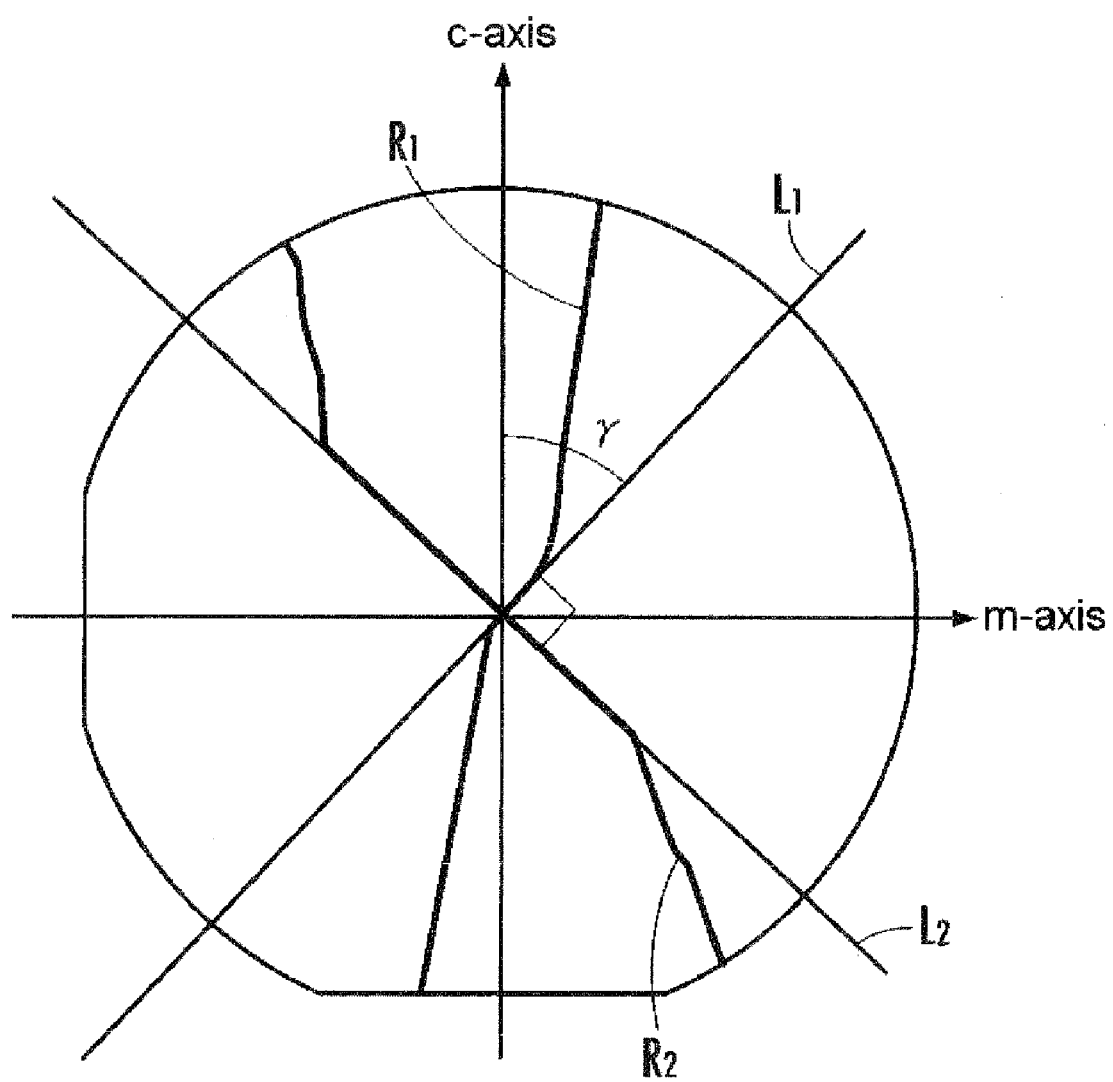
FIG. 1 is a diagram illustrating the results of cleavage in a conventional method for manufacturing a semiconductor light emitting element.
Figure 2A:
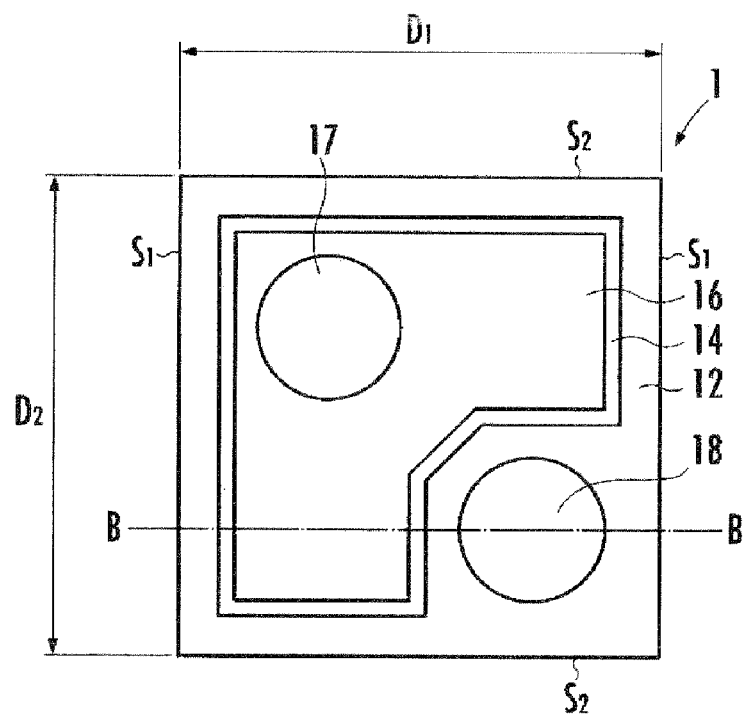
FIGS. 2A and 2B are explanatory views of a ZnO-based semiconductor light emitting element according to an embodiment of the present invention.
Figure 2B:
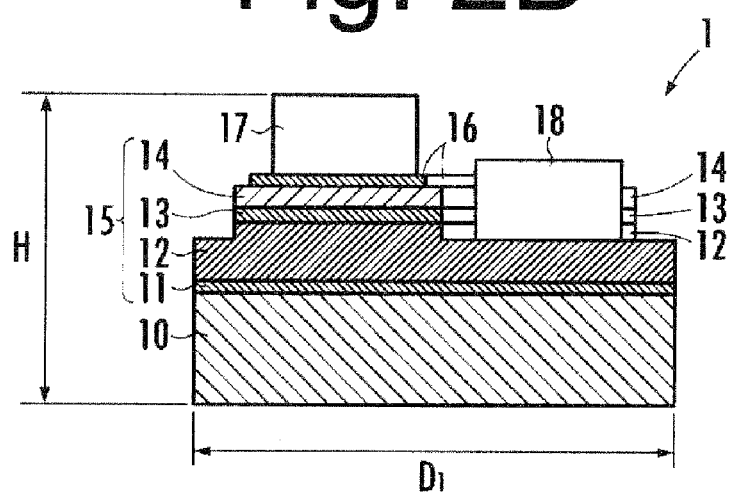
Figure 3:
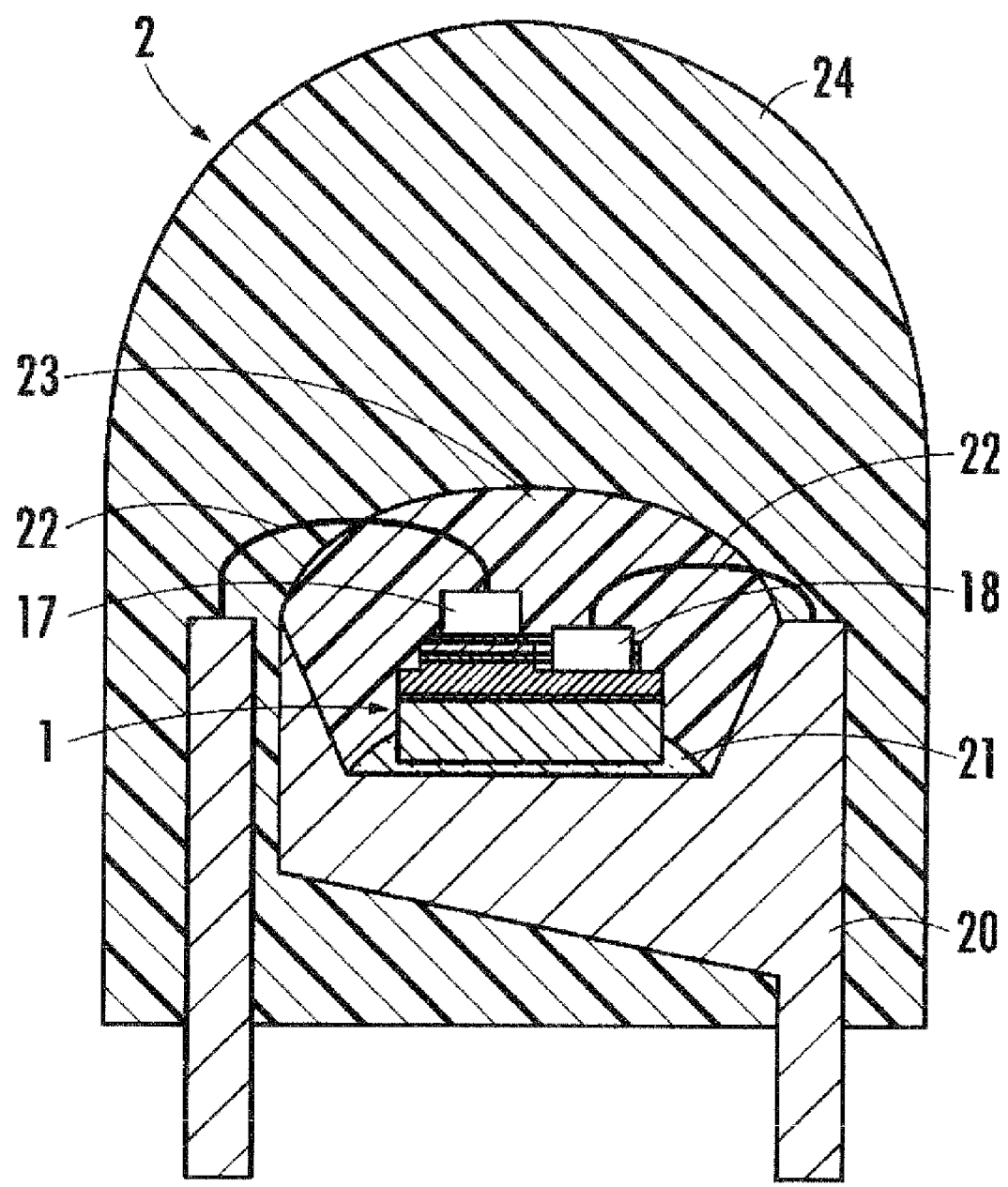
FIG. 3 is an explanatory cross-sectional view illustrating an LED lamp using the ZnO-based semiconductor light emitting element shown in FIGS. 2A and 2B.

Next, preferred embodiments of the present invention will be described in more detail with reference to the accompanying drawings. FIG. 2A is a schematic plan view illustrating a ZnO-based semiconductor light emitting element of one embodiment according to the present invention. FIG. 2B is a schematic cross-sectional view taken along line B-B in FIG. 2A. FIG. 3 is a cross-sectional view of an LED lamp using the ZnO-based semiconductor light emitting element shown in FIGS. 2A and 2B. FIGS. 4 and 5A to 5E describe a method for manufacturing the ZnO-based semiconductor light emitting element shown in FIGS. 2A and 2B.

The ZnO-based semiconductor light emitting element 1 (hereinafter simply referred to as a semiconductor light emitting element) of the present embodiment shown in FIGS. 2A and 2B can include a ZnO-based semiconductor layer serving as an operating layer. The ZnO-based semiconductor layer can be formed on a sapphire A-plane substrate 10 made of an α-sapphire single crystal and having a principal surface lying in the A plane {11-20}.

More specifically, the semiconductor light emitting element 1 can include a ZnO-based semiconductor layer 15 stacked on the surface of the sapphire A-plane substrate 10. The ZnO-based semiconductor layer 15 can include a buffer layer 11 composed of a ZnO layer, an n-type ZnO-based semiconductor layer 12 composed of an MgZnO layer, a multiple quantum well layer 13 serving as a light emitting layer and composed of MgZnO layers and ZnO layers containing no impurities, and a p-type ZnO-based semiconductor layer 14 composed of a nitrogen-doped MgZnO layer. The ZnO-based semiconductor layer 15 can have a substantially L-shape in plan view that is formed by partially removing the n-type ZnO-based semiconductor layer 12, the multiple quantum well layer 13, and the p-type ZnO-based semiconductor layer 14. A p-side electrode 16 (transparent electrode) can be stacked on the front surface of the p-type ZnO-based semiconductor layer 14 of the ZnO-based semiconductor layer 15, and a p-side electrode pad 17 can be attached to the p-side electrode 16. An n-side electrode pad 18 can be attached to the front surface of the n-type ZnO-based semiconductor layer 12 and located outside the L-shaped area.

The sapphire A-plane substrate 10 can have a first width $D_1$ and a second width $D_2$ of 400 μm and a thickness of 200 μm. The front surface of the sapphire A-plane substrate 10 lies in the c-m plane formed by the c and m axes of the α sapphire single crystal. The sapphire A-plane substrate 10 can have a rectangular shape in plan view and can be surrounded by two parallel first side edges $S_1$ forming an angle of 53.7° with respect to the m axis and two parallel side edges $S_2$ orthogonal to the first side edges $S_1$.

The widths $D_1$ and $D_2$ of the sapphire A-plane substrate 10 can be 400 μm, and the thickness thereof can be 200 μm. Therefore, the semiconductor light emitting element 1 can be configured such that the aspect ratio (the ratio of the width $D_1$ or $D_2$ to the height H, $D_1$ or $D_2$/H) is 2.

The semiconductor light emitting element 1 of the present embodiment can be used in, for example, an LED lamp 2, as shown in FIG. 3. In such a case, the semiconductor light emitting element 1 can be die-bonded and secured to a frame 20 with a transparent resin 21. The electrode pads 17 and 18 can be wire-bonded to the frame 20 with gold wires 22. The semiconductor light emitting element 1 can be covered with a fluorescent material 23 composed of a resin containing blue, yellowish green, and red fluorescent materials dispersed therein. All the components of the semiconductor light emitting element 1 can be covered with a resin mold 24. Since the sapphire A-plane substrate 10 can be formed into a rectangular shape, the semiconductor light emitting element 1 can be easily mounted using, for example, die-bonding.

As described above, the semiconductor light emitting element 1 of the present embodiment can be surrounded by the two parallel first side edges $S_1$ forming an angle of 53.7° with respect to the m axis and the two parallel second side edges $S_2$ orthogonal to the first side edges $S_1$. However, the present invention is not limited to this embodiment. For example, the first side edges $S_1$ may form an angle in the range of 52.7° to 54.7° with respect to the m axis or may form an angle in the range of 35.3° to 37.3° with respect to the m axis.

Next, with reference to FIGS. 2A and 2B, 4, and 5A to 5E, a description will be given of a method for manufacturing the semiconductor light emitting element 1 of the present embodiment. In FIGS. 5A to 5E, the buffer layer 11, the p-side electrode 16, the p-side electrode pad 17, and the n-side electrode pad 18 are omitted.

Figure 4:
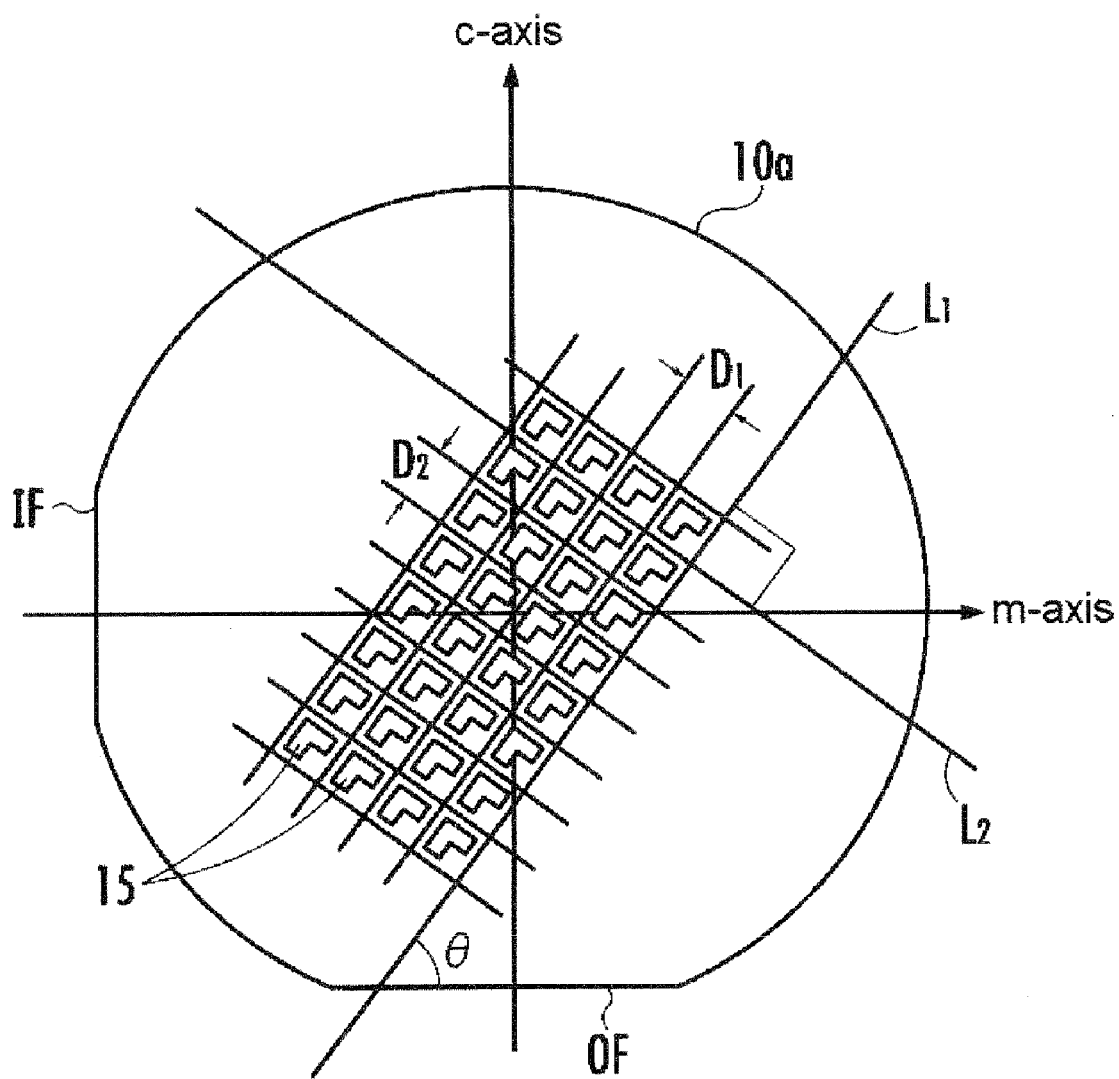
FIG. 4 is an explanatory view illustrating a method for manufacturing the ZnO-based semiconductor light emitting element shown in FIGS. 2A and 2B.

First, as shown in FIG. 4, a sapphire A-plane substrate 10a having a diameter of 50.8 mm (2 inches) and a thickness of 430 μm is prepared. Parts of the disc-shaped sapphire A-plane substrate 10a can be cut away, and the substrate 10a can have an orientation flat surface (hereinafter referred to as an OF surface) parallel to the m-axis and an index flat surface (hereinafter referred to as an IF surface) parallel to the c-axis.

Next, a ZnO layer is stacked on the front surface of the sapphire A-plane substrate 10a and grown at low temperatures, whereby the buffer layer 11 having a thickness of 10 nm can be formed as shown in FIGS. 2A and 2B.

Subsequently, an MgZnO layer is stacked on the buffer layer 11 and grown at high temperatures, whereby the n-type ZnO-based semiconductor layer 12 having a thickness of 2 μm or more can be formed. The composition of the MgZnO layer can be $Mg_xZn_{(1-x)}O$ (x=0).

Next, three sets of a ZnO layer containing no impurities and having a thickness of 2.5 nm and an MgZnO layer having a thickness of 7 nm are stacked on the n-type ZnO-based semiconductor layer 12, whereby the multiple quantum well layer 13 serving as a light emitting layer can be formed. The composition of the MgZnO layer can be $Mg_xZn_{(1-x)}O$ (x=0.1).

Figure 5A:
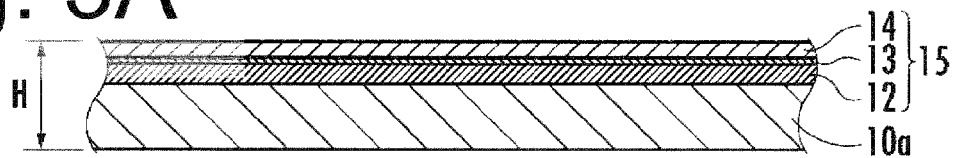
FIGS. 5A to 5E are explanatory views illustrating the method for manufacturing the ZnO-based semiconductor light emitting element shown in FIGS. 2A and 2B.

Subsequently, a nitrogen-doped MgZnO layer is stacked on the multiple quantum well layer 13, whereby the p-type ZnO-based semiconductor layer 14 having a thickness of 100 nm can be formed. The composition of the MgZnO layer can be $Mg_xZn_{(1-x)}O$ (x=0.2). The nitrogen concentration in the MgZnO layer can be $1 \times 10^{20}$ cm$^{-3}$. In this manner, the ZnO-based semiconductor layer 15 can be configured to include the buffer layer 11, the n-type ZnO-based semiconductor layer 12, the multiple quantum well layer 13, and the p-type ZnO-based semiconductor layer 14, with the layer 15 being formed on the sapphire A-plane substrate 10a, as shown in FIG. 5A. For example, a radical source molecular beam epitaxy apparatus that can supply oxygen radicals from an RF plasma gun may be used to form the ZnO-based semiconductor layer 15 described above.

Figure 5B:
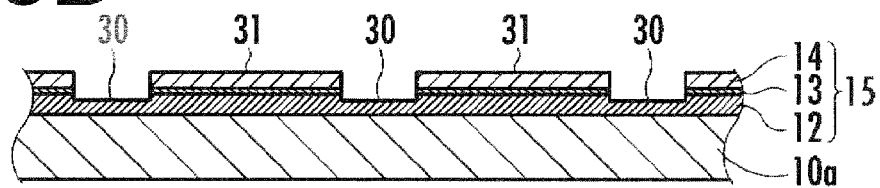

Next, a resist mask is formed on the ZnO-based semiconductor layer 15 by photolithography, and part of the ZnO-based semiconductor layer 15 is removed by wet etching or RIE (reactive ion etching). In this case, the n-type ZnO-based semiconductor layer 12 can be caused to appear on the etched areas. The resist mask is then washed away and removed, whereby element sections 31 can be formed on the front surface of the sapphire A-plane substrate 10a (the surface having the ZnO-based semiconductor layer 15 formed thereon) as shown in FIG. 5B. The element sections 31 can lie within square areas with a width $W_2$ of 300 μm that are separated by element section grooves 30 having a depth of 160 nm and a width $W_1$ of 100 μm. Each of the element sections 31 can have an L shape in plan view having two long side edges and can be formed such that a first long side edge of the L shape forms an angle of 53.7° with respect to the OF surface of the sapphire A-plane substrate 10a and that a second long side edge is orthogonal to the first long side edge.

Next, a resist mask having openings is formed on the front surface of the sapphire A-plane substrate 10a by photolithography. An Ni layer having a thickness of 0.3 to 10 nm is deposited on the resist mask by EB (electron beam) vapor deposition, and an Au layer having a thickness of 5 to 20 μm is deposited on the Ni layer. In this manner, a structure including the Ni layer serving as a first layer and the Au layer serving as a second layer stacked thereon (hereinafter referred to as an Ni—Au stacked structure) can be formed on the p-type ZnO-based semiconductor layer 14. Subsequently, the resist mask and the Ni—Au stacked structure (except for the portions of the Ni—Au stacked structure deposited in the openings of the resist mask) are removed by the lift-off method. By doing so, Ni—Au stacked structures having a shape of the p-side electrode 16 can remain on the p-type ZnO-based semiconductor layer 14. Next, the Ni—Au stacked structures are subjected to transparentizing treatment at 500° C. in a 10% oxygen atmosphere for 30 seconds using an RTA (rapid thermal annealer). In this manner, each p-side electrode 16 (transparent electrode) is formed on the p-type ZnO-based semiconductor layer 14, as shown in FIGS. 2A and 2B.

Next, a resist mask having openings and in contact with part of each p-side electrode 16 is formed on the front surface of the sapphire A-plane substrate 10a by photolithography. Subsequently, an Ni layer having a thickness of 3 to 10 nm, a Pt layer having a thickness of 100 nm, and an Au layer having a thickness of 1,000 nm are deposited by EB vapor deposition. Then, the resist mask and the Ni, Pt, and Au layers (except for the portions of the layers deposited in the openings of the resist mask) are removed by the lift-off method. In this manner, each p-side electrode pad 17 having a diameter of 100 μm can be formed on the p-side electrode 16, as shown in FIGS. 2A and 2B.

Next, a resist mask having openings is formed on the exposed areas of the front surface of the n-type ZnO-based semiconductor layer 12 by photolithography. Subsequently, a Ti layer having a thickness of 10 to 100 nm and an Au layer having a thickness of 1,000 nm are deposited by EB vapor deposition. Then, the resist mask and the Ti and Au layers (except for the portions of the layers deposited in the openings of the resist mask) are removed. In this manner, each n-side electrode pad 18 having a diameter of 100 μm can be formed on the exposed area of the n-type ZnO-based semiconductor layer 12, as shown in FIGS. 2A and 2B, and the ZnO-based semiconductor layer 15 and other components can be formed on the sapphire A-plane substrate 10a.

Next, the sapphire A-plane substrate 10a having the ZnO-based semiconductor layer 15 and other components formed thereon is applied to a protection substrate such that the surface having the ZnO-based semiconductor layer 15 formed thereon faces the protection substrate. Then, the rear surface of the sapphire A-plane substrate 10a (the surface opposite to the surface having the ZnO-based semiconductor layer 15 formed thereon) is ground using a grinding machine. Subsequently, the ground surface of the sapphire A-plane substrate 10a is mirror-polished using a polishing machine, whereby the sapphire A-plane substrate 10a having a thickness of 200 μm can be formed. By grinding and polishing the sapphire A-plane substrate 10a, the thickness of the sapphire A-plane substrate 10a is adjusted such that the aspect ratio (the ratio of width $D_1$ or $D_2$ to height H, $D_1$ or $D_2/H$) of the semiconductor light emitting element 1 to be formed is 2.

Figure 5C:
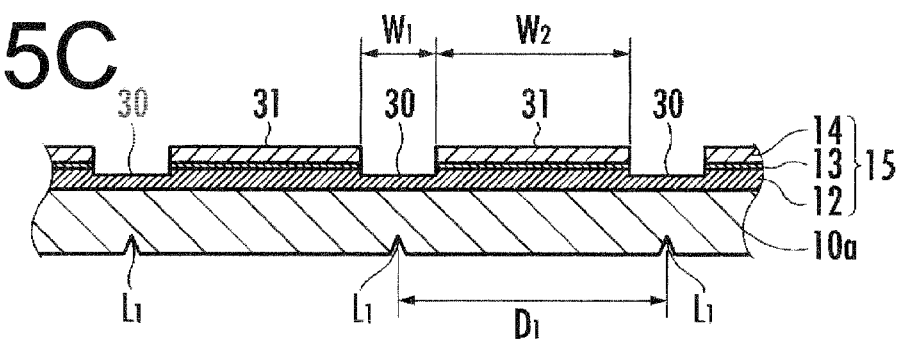

Next, the protection substrate applied to the front surface of the sapphire A-plane substrate 10a (the surface having the ZnO-based semiconductor layer 15 formed thereon) is peeled off, and a protection sheet is applied to the front surface instead. The sapphire A-plane substrate 10a having the protection sheet applied thereto is attached to a scribing machine. The scribing machine has a point tool having 3 points, and the point tool is attached such that the edge angle is 70°. The load coefficient is set to 20. First scribed grooves $L_1$ are formed on the rear surface of the sapphire A-plane substrate 10a using the scribing machine so as to be located at positions corresponding to the central portions of the element section grooves 30, as shown in FIG. 5C. Then, the sapphire A-plane substrate 10a is rotated by 90°, and second scribed grooves $L_2$ are similarly formed at positions corresponding to the central portions of the element section grooves 30. In this manner, as shown in FIGS. 4 and 5C, a plurality of parallel first scribed grooves $L_1$ can be formed on the rear surface of the sapphire A-plane substrate 10a at intervals $D_1$ of 400 μm so as to form an angle θ of 53.7° with respect to the OF surface (i.e., the m axis) of the sapphire A-plane substrate 10a. Also, a plurality of parallel second scribed grooves $L_2$ orthogonal to the first scribed grooves $L_1$ can be formed on the rear surface at intervals $D_2$ of 400 μm.

Figure 5D:
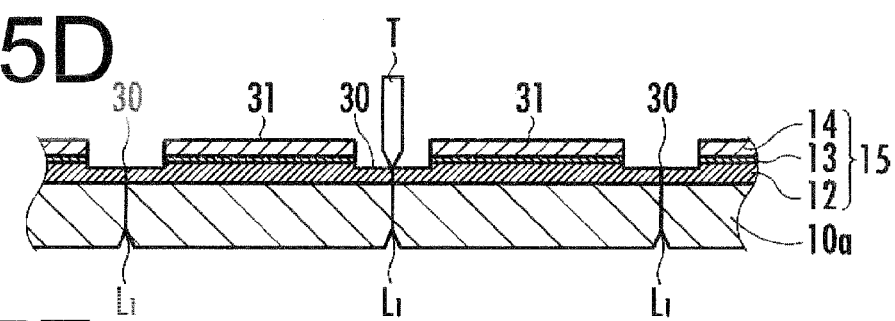

Next, an expansion sheet is applied to the rear surface of the sapphire A-plane substrate 10a on which the scribed grooves $L_1$ and $L_2$ have been formed. Then, this sapphire A-plane substrate 10a is attached to a breaking machine. The knife edge of the point tool T of the breaking machine is brought into abutment against the front surface of the sapphire A-plane substrate 10a so as to be located at a position corresponding to the position of the first scribed groove $L_1$, as shown in FIG. 5D, and a load is applied to cleave the sapphire A-plane substrate 10a along the first scribed groove $L_1$. Subsequently, the sapphire A-plane substrate 10a is rotated by 90°, and the sapphire A-plane substrate 10a is similarly cleaved along the second scribed grooves $L_2$.

Figure 5E:
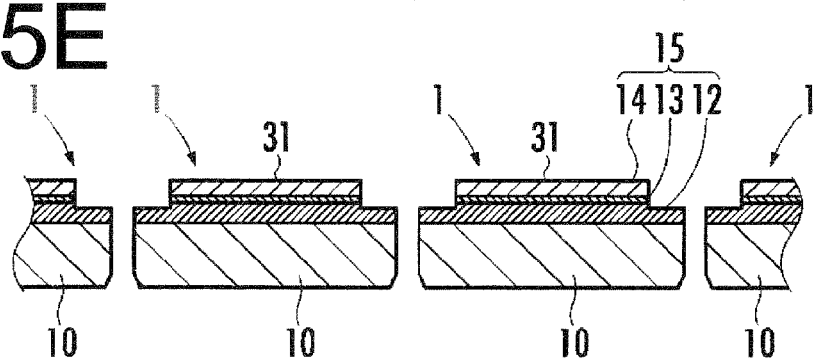

Next, the protection sheet applied to the front surface of the sapphire A-plane substrate 10a cleaved along the scribed grooves $L_1$ and $L_2$ is peeled off, and the expansion sheet applied to the rear surface of the sapphire A-plane substrate 10a is expanded, whereby the sapphire A-plane substrate 10a can be divided into separate rectangular sapphire A-plane substrates 10, as shown in FIG. 5E.

In this manner, the semiconductor light emitting element 1 can be completed so that the sapphire A-plane substrate 10a is divided into the separate rectangular sapphire A-plane substrates 10, and the elements 1 each include the ZnO-based semiconductor layer 15 formed on the rectangular sapphire A-plane substrate 10.

In the method for manufacturing a semiconductor light emitting element of the present embodiment, the thickness of the sapphire A-plane substrate 10a is adjusted to 200 μm by grinding and polishing it such that the aspect ratio of the semiconductor light emitting elements 1 produced by dividing the sapphire A-plane substrate 10a having the ZnO-based semiconductor layer 15 formed thereon is 2. However, the present invention is not limited to the present embodiment. For example, semiconductor light emitting elements 1 having an aspect ratio in the range of 2 to 4 can be manufactured by changing the thickness of the sapphire A-plane substrate 10a in the range of 50 to 200 μm.

When the aspect ratio of the semiconductor light emitting element 1 produced by dividing the sapphire A-plane substrate 10a having the ZnO-based semiconductor layer 15 formed thereon is 4 or less, 3 or less, or about 2, the light emission area of the side surfaces of the semiconductor light emitting element 1 is greater than that of a semiconductor light emitting element having an aspect ratio of greater than 4. Therefore, the light emitting power of the semiconductor light emitting element 1 can be increased.

Preferably, the first scribed grooves $L_1$ form an angle θ of 52.7° to 54.7° with respect to the m-axis. More preferably, as in the above embodiment, the angle θ with respect to the m axis is in the range of 53.2° to 54.2°.

In the manufacturing method of the above embodiment, the first scribed grooves $L_1$ may be formed such that the angle with respect to the m-axis is in the range of 35.3° to 37.3°. In such a case, a semiconductor light emitting element can be obtained which is surrounded by two parallel first side edges forming an angle of 35.3° to 37.3° with the m-axis and two parallel second side edges orthogonal to the first side edges.

A method for manufacturing the ZnO-based semiconductor light emitting element 1 including the ZnO-based semiconductor layer 15 formed on the sapphire A-plane substrate 10 has been described above. However, the present invention is not limited to the present embodiment. The manufacturing method of the above embodiment can be applied to a sapphire A-plane substrate having a thickness of 50 to 500 μm and not including the ZnO-based semiconductor layer 15. According to the manufacturing method of the above embodiment, a rectangular sapphire A-plane substrate having a thickness of 50 to 500 μm can be obtained.

In the method for manufacturing a sapphire A-plane substrate of the above embodiment, the sapphire A-plane substrate is cleaved along the first scribed grooves $L_1$ and then along the second scribed grooves $L_2$, whereby the sapphire A-plane substrate can be divided into separate rectangular substrates. When the sapphire A-plane substrate before cleavage has a disk-like shape with a thickness of 300 μm or more, the circumferential portion extending inwardly 2 mm from the circumferential edge of the sapphire A-plane substrate suffers from radial stress at the time of cleavage, so that the cleavage plane is likely to be curved. However, with the method for manufacturing a sapphire A-plane substrate of the above embodiment, even the circumferential portion can be cleaved along the scribed grooves $L_1$ and $L_2$. Therefore, according to the manufacturing method of the above embodiment, even when a sapphire A-plane substrate having a thickness of 50 to 500 μm is used, rectangular sapphire A-plane substrates can be obtained with a yield of 96 to about 100%.

It will be apparent to those skilled in the art that various modifications and variations can be made in the present invention without departing from the spirit or scope of the presently disclosed subject matter. Thus, it is intended that the present invention cover the modifications and variations of the presently disclosed subject matter provided they come within the scope of the appended claims and their equivalents.

What is claimed is:

1. A ZnO-based semiconductor light emitting element comprising:
   a sapphire A-plane substrate made of an α-sapphire single crystal and having a principal surface lying in an A-plane {11-20} of the α-sapphire single crystal; and
   a ZnO-based semiconductor layer formed on the sapphire A-plane substrate,
   wherein the sapphire A-plane substrate has a thickness of 50 to 200 μm and is surrounded by two parallel first side edges and two parallel second side edges orthogonal to the two parallel first side edges, the two parallel first side edges forming an angle in a range of 52.7° to 54.7° or in a range of 35.3° to 37.3° with respect to an m-axis of the α-sapphire single crystal that is orthogonal to a c-axis of the α-sapphire single crystal.

2. The ZnO-based semiconductor light emitting element according to claim 1, wherein an aspect ratio of a length of one of the side edges of the ZnO-based semiconductor light emitting element to a height of the ZnO-based semiconductor light emitting element is in a range of 2 to 4.

3. The ZnO-based semiconductor light emitting element according to claim 2, wherein the aspect ratio is in a range of 2 to 3.

4. The ZnO-based semiconductor light emitting element according to claim 3, wherein the aspect ratio is 2.

5. The ZnO-based semiconductor light emitting element according to claim 1, wherein the two parallel first side edges form an angle in the range of 52.7° to 54.7° with respect to the m-axis of the α-sapphire single crystal.

6. The ZnO-based semiconductor light emitting element according to claim 5, wherein the two parallel first side edges form an angle in the range of 53.2° to 54.2° with respect to the m-axis of the α-sapphire single crystal.

7. The ZnO-based semiconductor light emitting element according to claim 6, wherein the two parallel first side edges form an angle of 53.7° with respect to the m-axis of the α-sapphire single crystal.

* * * * *